(12) United States Patent
Patel et al.

(10) Patent No.: US 9,041,203 B2
(45) Date of Patent: May 26, 2015

(54) SYSTEM AND METHOD FOR MULTI-LAYER GLOBAL BITLINES

(75) Inventors: Zubin Patel, San Jose, CA (US); Nian Yang, Mountain View, CA (US); Fan Wan Lai, San Jose, CA (US); Alok Nandini Roy, San Jose, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 823 days.

(21) Appl. No.: 12/249,261

(22) Filed: Oct. 10, 2008

(65) Prior Publication Data

US 2010/0090337 A1      Apr. 15, 2010

(51) Int. Cl.
*H01L 23/38* (2006.01)
*H01L 23/522* (2006.01)

(52) U.S. Cl.
CPC ..... *H01L 23/5222* (2013.01); *H01L 2924/0002* (2013.01)

(58) Field of Classification Search
CPC .................................................. H01L 23/5222
USPC .............. 257/758, 775, E21.575; 365/185.13
See application file for complete search history.

(56) References Cited

U.S. PATENT DOCUMENTS

| | | | |
|---|---|---|---|
| 6,500,706 B1 * | 12/2002 | Chi | 438/239 |
| 6,873,007 B2 * | 3/2005 | Sugita et al. | 257/321 |
| 7,199,471 B2 * | 4/2007 | Houston | 257/758 |
| 2002/0024144 A1 * | 2/2002 | Keeth | 257/758 |
| 2002/0153545 A1 * | 10/2002 | Tomishima | 257/296 |
| 2003/0146515 A1 * | 8/2003 | Kajiyama | 257/758 |
| 2009/0004843 A1 * | 1/2009 | Mokhlesi et al. | 438/622 |

* cited by examiner

*Primary Examiner* — Jose R Diaz

(57) ABSTRACT

A system and method for manufacturing a semiconductor device including multi-layer bitlines. The location of the bitlines in multiple layers provides for increased spacing and increased width thereby overcoming the limitations of the pitch dictated by the semiconductor fabrication process used. The bitlines locations in multiple layers thus allows the customization of the spacing and width according to the use of a semiconductor device.

19 Claims, 7 Drawing Sheets

SYSTEM AND METHOD FOR MULTI-LAYER GLOBAL BITLINES

FIELD OF THE INVENTION

The present invention relates to the field of semiconductors. More particularly, the present invention relates to a system and method for a multi-layer global bitlines.

BACKGROUND OF THE INVENTION

Electronic systems and circuits have made a significant contribution towards the advancement of modern society and are utilized in a number of applications to achieve advantageous results. Electronic technologies such as digital computers, calculators, audio devices, video equipment, and telephone systems have facilitated increased productivity and reduced costs in analyzing and communicating data, ideas and trends in most areas of business, science, education and entertainment. Correspondingly, as technology has advanced, electronic technologies are increasingly shrinking in size. As electronic components shrink, electrical interference and other negative effects on electrical components, such as wires, have an increasingly large impact. The tiny widths and close proximity of adjacent bitlines introduces resistance and capacitance (RC) delays that can hinder chip performance.

FIG. 1 shows a cross section of a conventional configuration of global bitlines of a semiconductor device 100. Each of bitlines 102-110 are within layer 101 and are separated by a fixed spacing 116. Bitlines 102-110 further have a uniform width 114. The width of each of the bitlines has an impact on the resistance of the bitline.

The characteristic of a bitline configuration is known as pitch which is the width of the bitline and the spacing between that bitline plus the adjacent bitline. The pitch is thus shown by distance 112. Conventionally, the pitch is fixed based on the semiconductor manufacturing process, such as 90 mm. The fixing of the pitch has thus limited conventional solutions to making changes to the spacing between the bitlines or changing the width of the bitlines.

Unfortunately, the fixed nature of the pitch also results in a constant RC delay making changes to the width or spacing ineffective in changing the RC delay. For example, when the width is increased, thereby reducing the resistance, the reduced spacing results in an increase in capacitance. Similarly, when the spacing is increased, thereby reducing the capacitance, the reduced width results in an increased resistance.

The capacitance portion of the RC delay may be expressed by the equation:

$$C = K\varepsilon_0 \frac{A}{D}$$

Where A is the area, D is the distance between bitlines, K is the dielectric constant of the material, and $\varepsilon_0$ is the permittivity of free space. The area (A) and thickness (D) are governed by the microelectronic chip size.

Conventional solutions have been focused on using materials which have a low dielectric constant. Unfortunately, the use of new materials is expensive because it requires new equipment, new tools, and achieving a yield matching previous methods and materials is increasingly difficult.

Accordingly, what is needed is a bitline configuration which overcomes the RC delay of conventional designs to allow semiconductor devices to be made smaller.

SUMMARY OF THE INVENTION

A system and method for manufacturing a semiconductor device including multi-layer bitlines. The location of the bitlines in multiple layers provides for increased spacing and increased width thereby overcoming the limitations of the pitch dictated by the semiconductor fabrication process used. The bitlines locations in multiple layers thus allows the customization of the spacing and width according to the use of a semiconductor device.

The system and method of the present invention facilitate use of bitlines with reduced capacitance by utilizing more than one layer for the bitlines. The reduced capacitance and increased spacing of the bitline allows increasing the width of the bitlines thereby reducing the resistance. Further, the ability to increase the spacing and width of the bitlines allows the bitlines to be customized for (e.g., performance) the target application or use of the semiconductor device. Moreover, the bitlines may switch layers so as to maintain substantially equal capacitance thereby making the time constant of a semiconductor device uniform. Embodiments of the present invention provide the aforementioned advantageous properties without the introduction of new materials or equipment and correspondingly little to no change in cost.

DETAILED DESCRIPTION OF THE INVENTION

Figure 1:
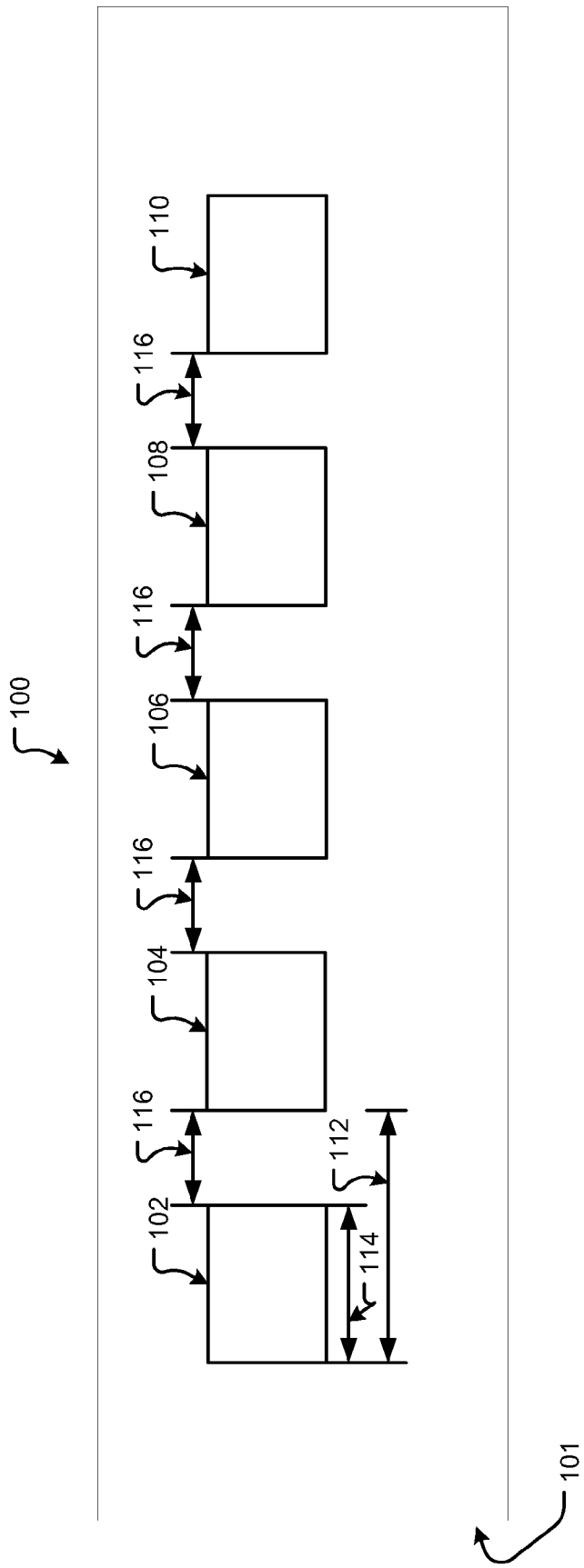
FIG. 1 is a block diagram of a cross section of a conventional bitline configuration.

Reference will now be made in detail to the preferred embodiments of the invention, a semiconductor isolation material deposition system and method, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

Some portions of the detailed descriptions which follow are presented in terms of procedures, logic blocks, processing, and other symbolic representations of operations on data bits within a computer memory. These descriptions and representations are the means generally used by those skilled in data processing arts to effectively convey the substance of their work to others skilled in the art. A procedure, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical, or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are associated with the appropriate physical quantities and are merely convenient labels applied to these quantities. Unless specifically stated otherwise as apparent from the following discussions, it is appreciated that throughout the present application, discussions utilizing terms such as "processing", "computing", "calculating", "determining", "displaying" or the like, refer to the action and processes of a computer system, or similar processing device (e.g., an electrical, optical, or quantum, computing device), that manipulates and transforms data represented as physical (e.g., electronic) quantities. The terms refer to actions and processes of the processing devices that manipulate or transform physical quantities within a computer system's component (e.g., registers, memories, other such information storage, transmission or display devices, etc.) into other data similarly represented as physical quantities within other components.

Figure 2:
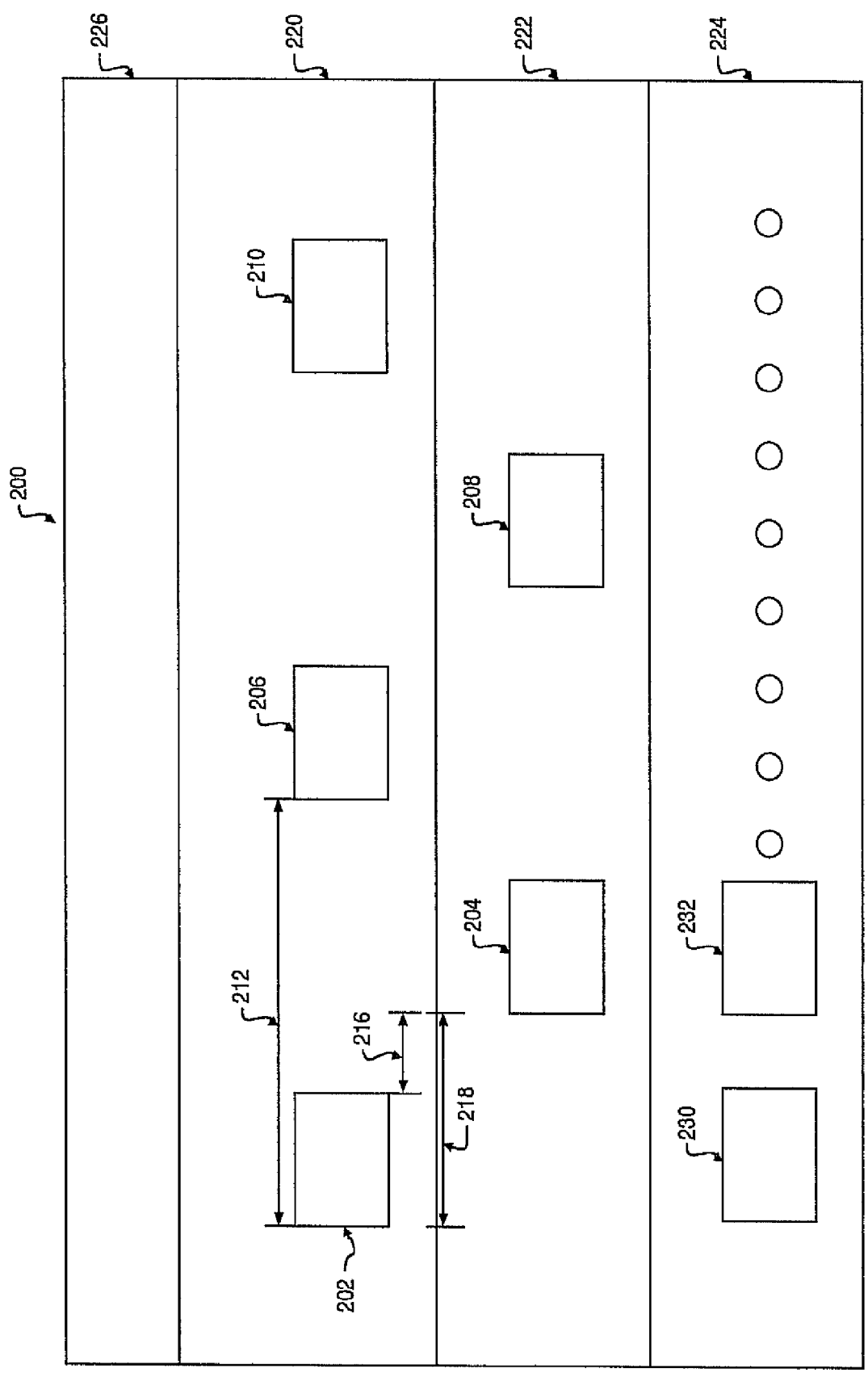
FIG. 2 is a block diagram of a cross section of an exemplary bitline arrangement in accordance with an embodiment of the present invention.

FIG. 2 is a block diagram of a cross section of an exemplary bitline arrangement in accordance with an embodiment of the present invention. Semiconductor device 200 includes bitlines 202-210, terminal metal layer 226, and layers 220-224. Terminal metal layer 226 facilitates the communicative coupling of semiconductor device 200 to another device (e.g., processor, memory device, peripheral, audio/video device, etc.). For example, a pad coupled to terminal metal layer 226 may allow semiconductor device 200 (e.g., a memory device) to communicate with a processor or other electronic device. In one exemplary embodiment, terminal metal layer 226 includes an alloy of Aluminum and Copper. Semiconductor device 200 may be manufactured with a 45 mm and beyond (e.g., smaller) semiconductor manufacturing process.

In one embodiment, layers 220 and 222 are below terminal metal layer 226. Layer 220 includes bitlines 202, 206, and 210. Layer 222 includes bitlines 204 and 208. In one embodiment, bitlines 202-210 are global bitlines. Bitlines 202-210 may be made with variety of materials including, but not limited to, copper or tungsten. It is appreciated that portions of bitlines 202-210 may be within layer 220 and 222.

It is appreciated that one or more layers may be between layers 222 and 224. Further, it is appreciated that there may be local layer interconnects in layers between layers 222 and 224. In one embodiment, layer 220 may be a metal last (ML) layer and layer 222 may be a metal three (M3) layer. It is also appreciated that semiconductor device can have a variety of layers (e.g., 9 layers, 20 layers, etc.)

In one embodiment, bitlines 202-210 facilitate access to data in date storage elements 230, 232, and other data storage elements. It is appreciated that semiconductor device 200 may have other types of elements or devices in layer 224.

The horizontal component of the pitch of an embodiment of the present invention may be substantially similar to the pitch of the semiconductor fabrication process. For example, the horizontal pitch 218 may be fixed based on the semiconductor fabrication process and spacing 216 is accordingly sized based on the semiconductor fabrication process. Further, embodiments of the present invention in the horizontal plane may have two bitlines in two times the pitch (e.g., 212) defined by the semiconductor fabrication process. It is appreciated that embodiments of the present invention are not limited or restricted to the pitch of the semiconductor fabrication process.

Embodiments of the present invention thus increase the horizontal spacing between adjacent bitlines (e.g., bitlines 202 and 206) in the same layer (e.g., layer 220). The capacitance of adjacent bitlines may be expressed by the equation:

$$C = K\varepsilon_0 \frac{A}{D}$$

Where A is the area, D is the distance between bitlines, K is the dielectric constant of the material, and $\varepsilon_0$ is the permittivity of free space.

The increased spacing of embodiments of the present invention increases the distance between the bitlines (D) and thus the increased spacing results in a decrease in the capacitance. In one embodiment, the capacitance between adjacent bitlines is reduced by 50%. It is appreciated that the closeness of the layers (e.g., layers 220 & 222) can effect the capacitive load associated with each of the bitlines.

Correspondingly, the increased spacing allows for the width of bitlines 202-210 to be increased without substantially changing the capacitance on bitlines 202-210. The resistance of a bitline may be expressed by the equation:

$$R = \rho \frac{l}{A}$$

Where A is the cross sectional area, l is the length, and ρ is the resistivity of the material.

The increased spacing thus allows an increase in cross sectional area (A) or width which results in a decrease in resistance of the bitline. In one embodiment, the width on below layer (e.g., M3) can be used to compensate for the capacitance introduced by a terminal metal layer (e.g., terminal metal layer 226).

Embodiments of the present invention thus allow the resistance and capacitance to be customized for the target application or use of semiconductor device 200. For example, where the semiconductor device is a memory device (e.g., flash memory) the resistance (or width) and capacitance (or spacing) can be customized for read, erase, or program operations.

In one embodiment, semiconductor device 200 is a memory device (e.g., flash memory and the like). A memory device in accordance with an embodiment of the present invention may include a first data storage element (e.g., data storage element 230) and a second data storage element (e.g., data storage element 232) in a first layer (e.g., layer 224). The memory device further includes a first global bitline (e.g., bitline 202) for accessing the first data storage element (e.g., data storage element 230) and a second global bitline (e.g., bitline 204) for accessing the second data storage element (e.g., data storage element 232). The first global bitline is within a second layer and the second global bitline is within a third layer. The memory device may also include a fourth layer which includes a terminal metal (e.g., terminal metal layer 226).

In one embodiment, a portion the first global bitline may further be within the third layer and a portion of the second global bitline may be within the second layer. The first global bitline and the second global bitline may span one or more sectors within a single layer. The width of the first and the second global bitline may be customized for a target application of the memory device (e.g., cell phone, smart phone, computer, personal digital assistant, gaming console, audio/video device and the like).

Figure 3:
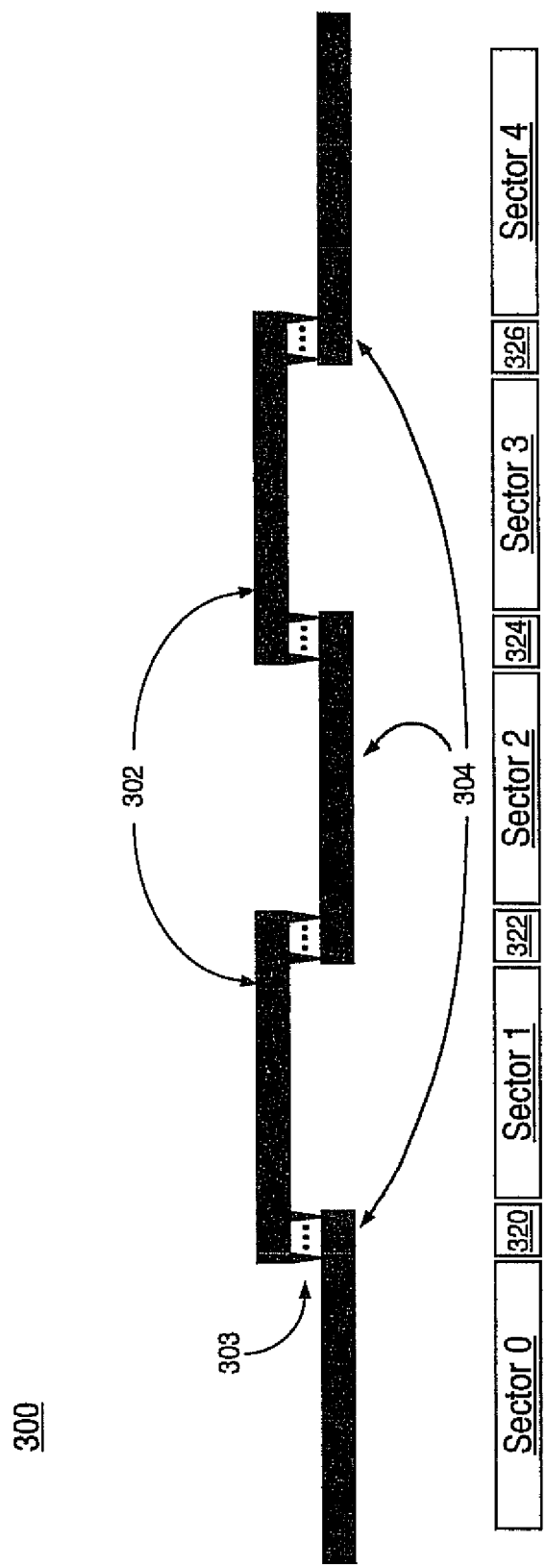
FIG. 3 is a block diagram of cross section of an exemplary bitline and the corresponding sectors in accordance with an embodiment of the present invention.

FIG. 3 is a block diagram of a cross section of an exemplary bitline and the corresponding sectors in accordance with an embodiment of the present invention. FIG. 3 illustrates a bitline spanning and switching layers over one or more sectors (e.g., sectors 0-4). Bitline 300 includes portions 302 in an upper or first layer, via 303, portions in lower or second layer 304. In one embodiment, bitline 300 is a global bitline which is alternatively connected or changes layers with each sector. The switching of layers may occur in a sector select area (e.g., sector select areas 320-326) with a via or layer interconnect (e.g., via 303). It is appreciated that the global bitlines may be in one or more layers and the layers may not be adjacent.

Referring to the previous example, a global bitline may start in an metal three (M3) layer in Sector 0, switch to metal last (ML) layer and continues in ML in Sector 1, switch to M3 in sector 2, switch to ML in sector 3, and switch to M3 in sector 4. In one embodiment, the switching occurs after each sector in the corresponding sector select area across the complete bank.

Figure 4:
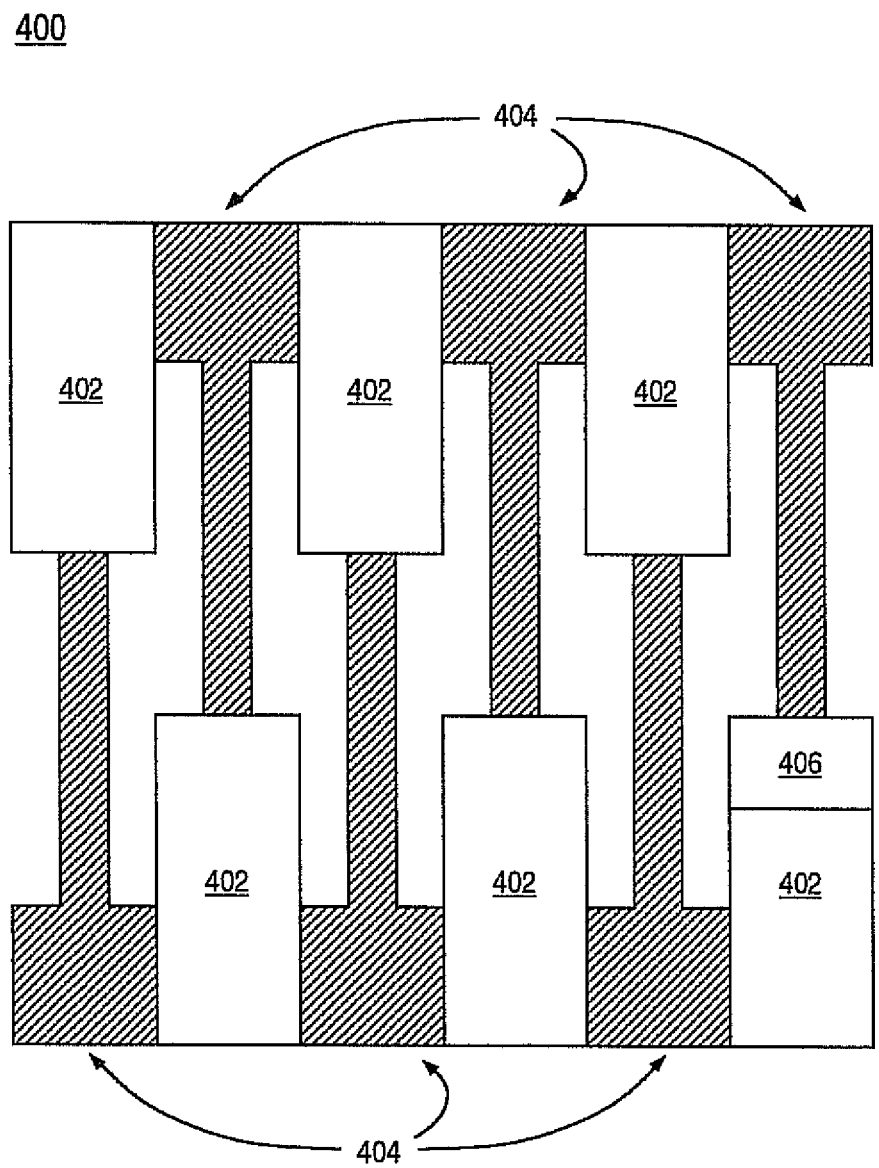
FIG. 4 is a block diagram of an exemplary switching region of an exemplary semiconductor device in accordance with an embodiment of the present invention.

FIG. 4 is a block diagram of an exemplary switching region of an exemplary semiconductor device in accordance with an embodiment of the present invention. As described herein, the bitlines may have a relatively increased width on each layer so the resistance is reduced.

In order to facilitate avoiding contact in areas of bitline layer changes, the bitlines are thinned down or reduced in width at points where there is a change in layers (e.g, with via 406). Portions of the bitlines 404 in a lower layer (e.g., M3) are reduced in width as layer changes to the portions of bitlines 402 in an upper layer (e.g., ML). In one embodiment, the bitlines have a reduced width in a sector select area. It is appreciated that embodiments may still include a horizontal spacing between bitlines on different layers (e.g., spacing 216 of FIG. 2).

Figure 5:
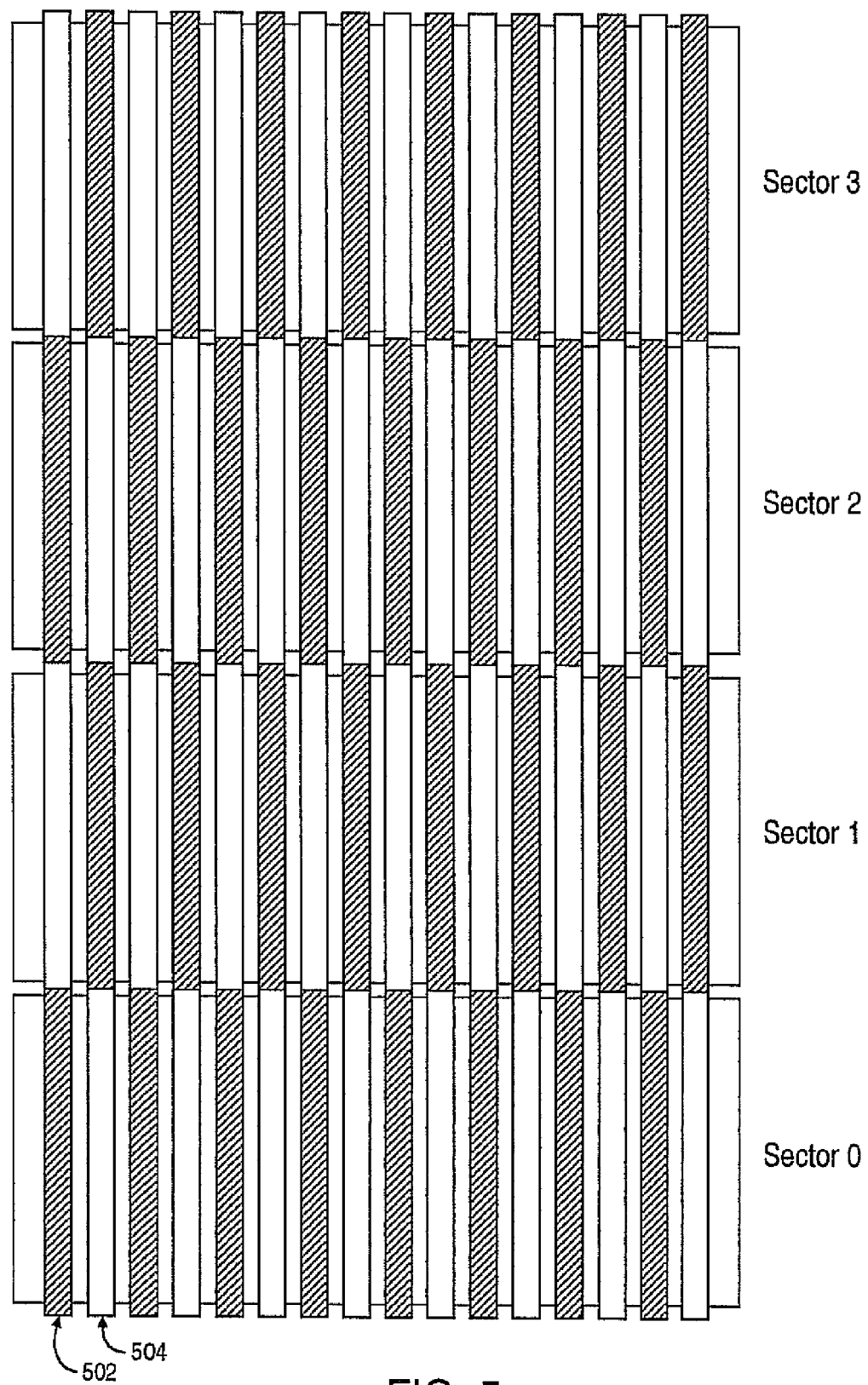
FIG. 5 is a block diagram of a top view of an exemplary bitline configuration of an exemplary semiconductor device in accordance with an embodiment of the present invention.
Figure 6:
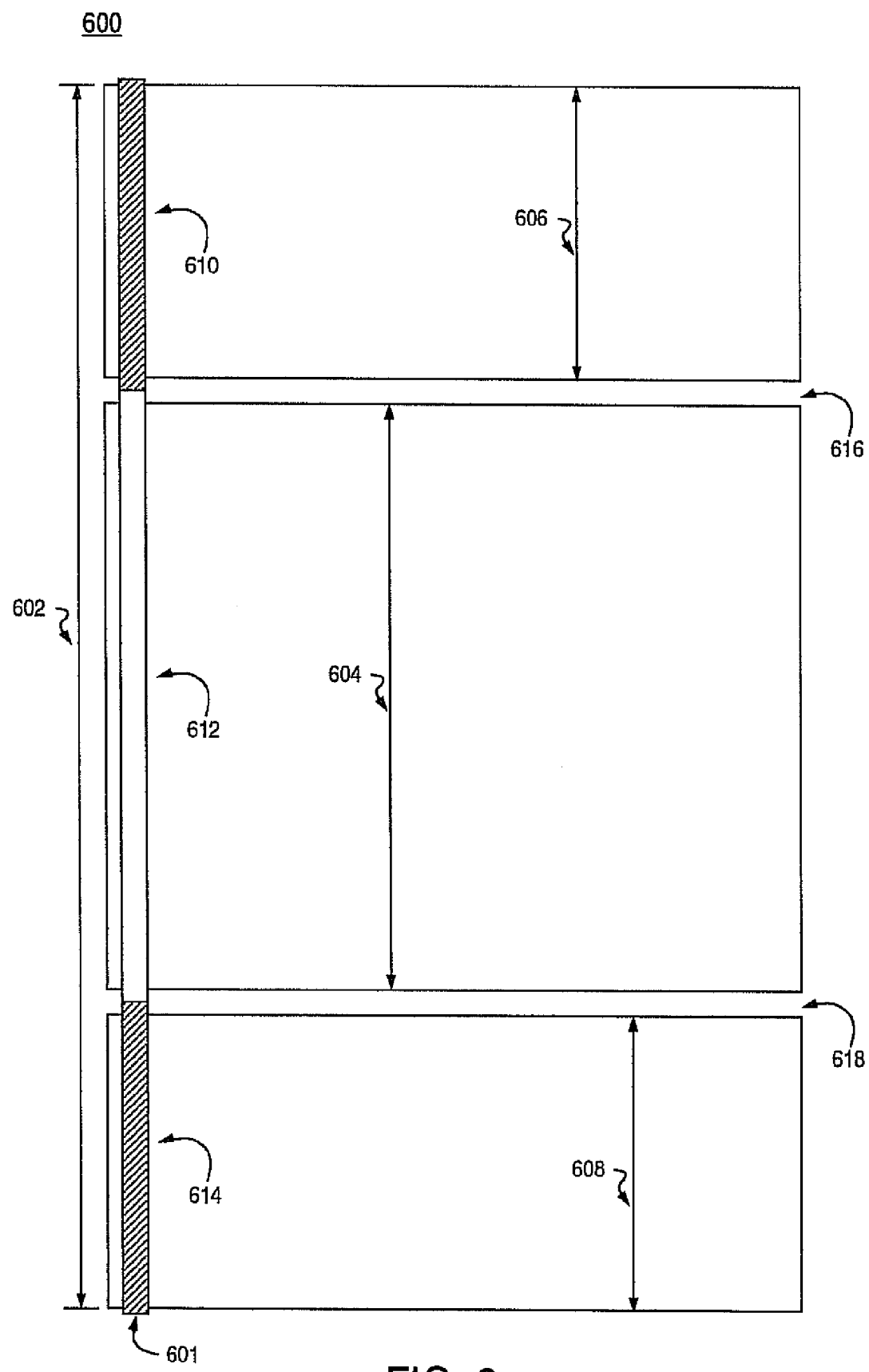
FIG. 6 is a block diagram of a top view of another exemplary bitline configuration in accordance with an embodiment of the present invention.

FIG. 5 is a block diagram of top view an exemplary bitline configuration of an exemplary semiconductor device in accordance with an embodiment of the present invention. Bitline 502 start on a lower layer (as shown by the stripes) (e.g., M3) in sector 0 and switches to an upper layer (e.g., ML) in sector 1. Bitline 504 starts in an upper layer (e.g., ML) in sector 0 and switches to a lower layer (e.g., M3) in sector 1. Bitlines 502 and 504 alternate switching layers as each sector is entered. Any variations in capacitance of each layer are dealt with by having substantially equal portions of each bitlines within each layer (e.g., an equal number of portions in a first or lower layer and a second or upper layer). This allows the capacitance across each bitline line to be substantially equal and thus the time constant across the semiconductor device (e.g., memory device) to be consistent or uniform. For example, for bitlines alternating layers with each sector with a M3 layer having a higher capacitance than a ML layer, having substantially equal portions of each bitline in the ML and M3 layers results in substantially similar capacitance across each bitline FIG. 6 is a block diagram of a top view of another exemplary bitline configuration in accordance with an embodiment of the present invention. Semiconductor device 600 includes exemplary bitline 601, sector select areas 616 and 618, and areas of one or more sectors 604, 606, and 608. In one embodiment, bitline 601 spans one or more sectors within a single layer. Bitline 601 includes portions 614 and 610 within a first layer (e.g., M3) and a portion 612 within a second layer (e.g., ML). In one embodiment, semiconductor 600 has a total number of sectors 602 with bitline 601 spanning the sectors.

For example, for a 512 Mb device where semiconductor 600 has 16 sectors, bitline portion 614 spans the 4 sectors of area 608 and 4 sectors of area 610 in a M3 layer. Bitline portion 612 spans the 8 sectors of area 604 in a ML layer. It is appreciated that substantially equal portions of bitline 601 are within each layer (e.g., layers M3 and ML) and bitlines could change layers in any pattern (e.g., every 2, 3, or 5 sectors) such that equal portions are within each layer.

Figure 7:
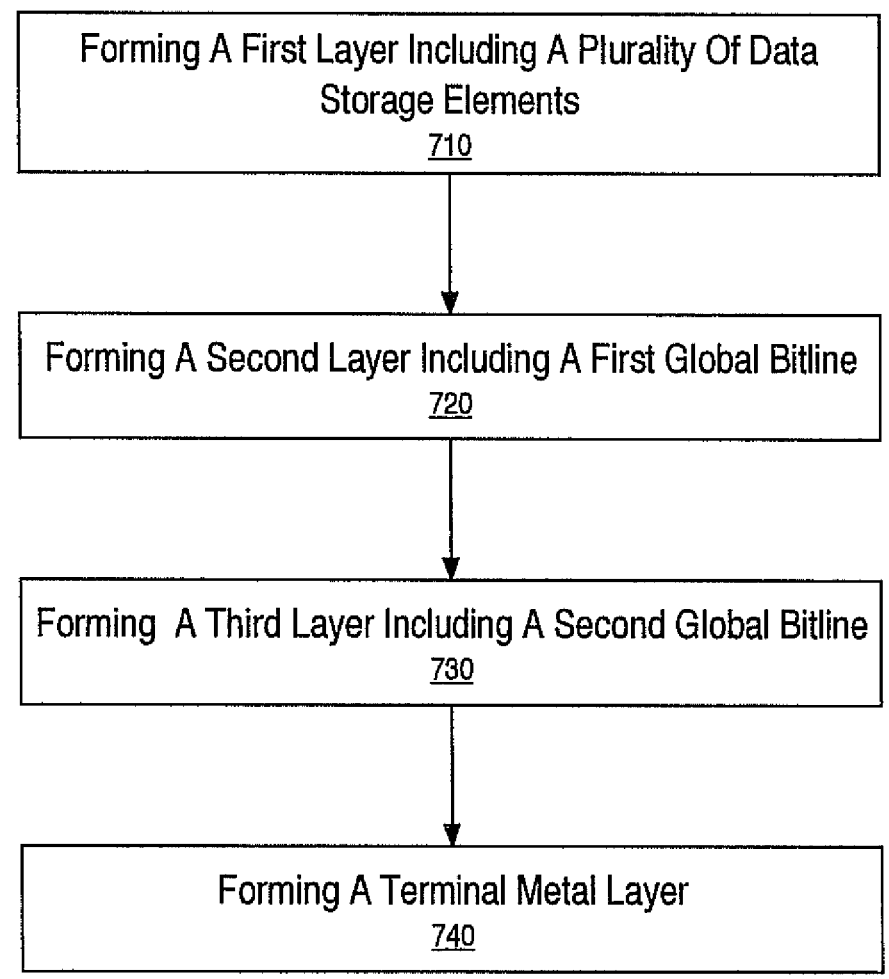
FIG. 7 is a flowchart of a method for manufacturing a semiconductor device in accordance with an embodiment of the present invention.

FIG. 7 is a flowchart of a method for manufacturing a semiconductor device in accordance with an embodiment of the present invention. With reference to FIG. 7, flowchart 700 illustrates example blocks used by various embodiments of the present technology. It is appreciated that the blocks of flowchart 700 may be performed in an order different than presented, and that not all of the blocks in flowchart 700 may be performed. Exemplary method 700 may be used to manufacture a portion of a memory device (e.g., semiconductor device 200). It is appreciated that flowchart 700 may be carried out by a semiconductor manufacturing device or fabrication device.

At block 710, a first layer is formed including a plurality of data storage elements. As described herein, the data storage elements may be memory cells of memory device.

At block 720, a second layer is formed including a first global bitline (e.g., bitline 202). The first global bitline may be for accessing a first portion of the plurality of data storage elements (e.g., data storage element 202).

At block 730, a third layer is formed including a second global bitline. The second global bitline (e.g., bitline 204) may be for accessing a second portion of the plurality of data storage elements (e.g, data storage element 232). As described herein, the third layer may further include a portion of the first global bitline and the second layer may further include a portion of the second global bitline. Further, substantially equal portions of the first global bitline and the second global bitline may be within the second layer and the third layer respectively. Portions of each global bitline switching layers (e.g., in sector select areas) may have a reduced width.

In one embodiment, the first and second global bitlines may span one or more sectors within a single layer. Further, where the first global bitline and the second global bitline are horizontally adjacent, the width of the first global bitline may be increased (e.g., to reduce resistance) without substantially changing the capacitance of the first global bitline and the second global bitline.

At block 740, a terminal metal layer for communicatively coupling the semiconductor device to another device (e.g., processor, memory device, peripheral, audio/video device, etc.).

Thus, a system and method of the present invention facilitates use of bitlines with reduced capacitance by utilizing more than one layer for the bitlines. The reduced capacitance and increased spacing of the bitline allows increasing the width of the bitlines thereby reducing the resistance. Further, the ability to increase the spacing and width of the bitlines allows the bitlines to be customized for (e.g., performance) the target application or use of the semiconductor device. Moreover, the bitlines may switch layers so as to maintain substantially equal capacitance thereby making the time constant of a semiconductor device uniform. Embodiments of the present invention provide the aforementioned advantageous properties without the introduction of new materials or equipment and correspondingly little to no change in cost.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A semiconductor device comprising:
   a terminal metal layer, wherein said terminal metal layer comprises a pad to couple said semiconductor device to another semiconductor device;
   a first layer and a second layer, wherein said first and said second layer are below said terminal metal layer;
   a third layer, wherein said third layer comprises a plurality of data storage elements, wherein each data storage element of said plurality of data storage elements is accessible to a different bitline positioned at different layers; and
   a plurality of bitlines wherein a first portion of said plurality of bitlines is in said first layer and a second portion of said plurality of bitlines is in said second layer, and wherein said first layer and said second layer are adjacent, wherein said first portion of said plurality of bitlines is further in said second layer and wherein said second portion of said plurality of bitlines is further in said first layer, wherein said first portion and said second portion of said plurality of bitlines switch layers over one or more sectors, wherein each sector has a different sector select area, and wherein a first portion of a first bitline of said first portion of said plurality of bitlines in said second layer comprises a first sub-portion of a first width and a second sub-portion of a second width.

2. The semiconductor device of claim 1 wherein said plurality of bitlines has a reduced width within a sector select area.

3. The semiconductor device of claim 1 wherein substantially equal portions of said plurality of bitlines are within said first layer and said second layer.

4. The semiconductor device of claim 1 wherein said plurality of bitlines spans one or more sectors within a single layer.

5. The semiconductor device of claim 1 wherein a horizontal pitch of a first bitline of said plurality of bitlines and second bitline of said plurality of bitlines is substantially similar to a pitch of a semiconductor fabrication process used in manufacturing said semiconductor device.

6. The semiconductor device of claim 1 wherein a width of said plurality of bitlines is increased without substantially changing the capacitance of said plurality of bitlines.

7. The semiconductor device of claim 6 wherein said width of said plurality of bitlines is customized for a target use of said semiconductor device.

8. The semiconductor device of claim 1 wherein a first distance between adjacent bitlines of said first portion of said plurality of bitlines is greater than a second distance between a first bitline of said first portion of said plurality of bitlines and a second bitline of said second portion of said plurality of bitlines.

9. The semiconductor device of claim 1 wherein said first portion of said plurality of bitlines comprises a first set of bitlines of said plurality of bitlines and wherein said second portion of said plurality of bitlines comprises a second set of bitlines of said plurality of bitlines.

10. The semiconductor device of claim 1 wherein said first portion and said second portion of the plurality of bitlines switch layers in a sector select area.

11. A memory device comprising:
    a first data storage element and a second data storage element, wherein said first data storage element and said second data storage element are within a first layer, wherein said first and second data storage elements are each accessible to a different bitline positioned at different layers;
    a first global bitline for accessing said first data storage element, wherein said first global bitline is within in a second layer;
    a second global bitline for accessing said second data storage element, wherein said second global bitline is within a third layer, and wherein said second layer and said third layer are adjacent, wherein a first portion of said first global bitline is in said third layer and wherein a second portion of said second global bitline is in said second layer, wherein said first global bitline and said second global bitline switch layers over one or more sectors, wherein each sector has a different sector select area; and
    a fourth layer, wherein said fourth layer comprises a terminal metal, wherein said fourth layer comprises a pad to couple said memory device to another memory device, and wherein said second portion of said second global bitline in second layer comprises a first sub-portion of a first width and a second sub-portion of a second width.

12. The memory device of claim 11 wherein said width of said first and said second global bitline is customized for a target application of said memory device.

13. The memory device of claim 11 wherein said first global bitline and said second global bitline span one or more sectors within a single layer.

14. The memory device of claim 11 wherein said first global bitline is further within said third layer and said second global bitline is further within said second layer.

15. A method of manufacturing a semiconductor device, comprising:
    forming a first layer, wherein said first layer comprises a plurality of data storage elements, wherein each data storage element of said plurality of data storage elements is accessible to a different bitline positioned at different layers;
    forming a second layer, wherein said second layer comprises a first global bitline for accessing a first portion of said plurality of data storage elements;

forming a third layer, wherein said third layer comprises a second global bitline for accessing a second portion of said plurality of data storage elements, and wherein said second layer and said third layer are adjacent; and forming a terminal metal layer, wherein said terminal metal layer comprises a pad to couple said semiconductor device to another device, wherein said third layer further comprises a first portion of said first global bitline and wherein said second layer further comprises a second portion of said second global bitline, wherein said first global bitline and said second global bitline switch layers over one or more sectors, wherein each sector has a different sector select area, and wherein said second portion of said second global bitline in second layer comprises a first sub-portion of a first width and a second sub-portion of a second width.

16. The method of claim 15 wherein said first global bitline has a reduced width within a sector select area.

17. The method of claim 15 wherein substantially equal portions of said first global bitline and said second global bitline are within said second layer and said third layer.

18. The method of claim 15 wherein said first global bitline spans one or more sectors within a single layer.

19. The method of claim 15 wherein a width of said first global bitline is increased without substantially changing the capacitance of said first global bitline and said second global bitline, wherein said first global bitline and said second global bitline are horizontally adjacent.

* * * * *